United States Patent [19]
Smith et al.

[11] Patent Number: 6,022,782
[45] Date of Patent: Feb. 8, 2000

[54] METHOD FOR FORMING INTEGRATED CIRCUIT TRANSISTORS USING SACRIFICIAL SPACER

[75] Inventors: Gregory Clifford Smith, Carrollton; Daniel Keith Smith, Arlington, both of Tex.

[73] Assignee: STMicroelectronics, Inc., Carrollton, Tex.

[21] Appl. No.: 08/866,895

[22] Filed: May 30, 1997

[51] Int. Cl.[7] .................................................. H01L 21/336
[52] U.S. Cl. .......................... 438/303; 438/305; 438/223
[58] Field of Search .................................. 438/305, 155, 438/223, 301, 303, 306, 307, 696, 725, 947, 945, 702, 482, 562, 597; 257/301, 344

[56] References Cited

U.S. PATENT DOCUMENTS

| | | | |
|---|---|---|---|
| 4,838,991 | 6/1989 | Cote et al. ............................... | 438/696 |
| 4,994,404 | 2/1991 | Sheng et al. ............................ | 438/305 |
| 5,055,898 | 10/1991 | Beilstein, Jr. et al. ................. | 438/155 |
| 5,118,382 | 6/1992 | Cronin et al. ........................... | 438/702 |
| 5,332,469 | 7/1994 | Mastrangelo ............................ | 438/977 |
| 5,502,336 | 3/1996 | Park et al. .............................. | 257/754 |
| 5,661,340 | 8/1997 | Ema et al. ............................... | 438/739 |

FOREIGN PATENT DOCUMENTS

| | | |
|---|---|---|
| 2-199847 | 8/1990 | Japan . |
| 6-209081 | 7/1994 | Japan . |

*Primary Examiner*—Charles Bowers
*Assistant Examiner*—Jack Chen
*Attorney, Agent, or Firm*—Theodore E. Galanthay; Lisa K. Jorgenson; Dan Venglarik

[57] ABSTRACT

An improved processing technique results in a structure which maximizes contact area by eliminating a sidewall spacer used to form LDD regions. A sacrificial spacer is provided during processing to form the LDD regions, and is then removed prior to further processing of the device. A sidewall spacer is then formed in a self-aligned contact from a later deposited oxide layer used as an interlevel dielectric. This leaves only a single oxide sidewall spacer alongside the gate electrode, maximizing the surface area available for the self-aligned contact itself.

22 Claims, 5 Drawing Sheets

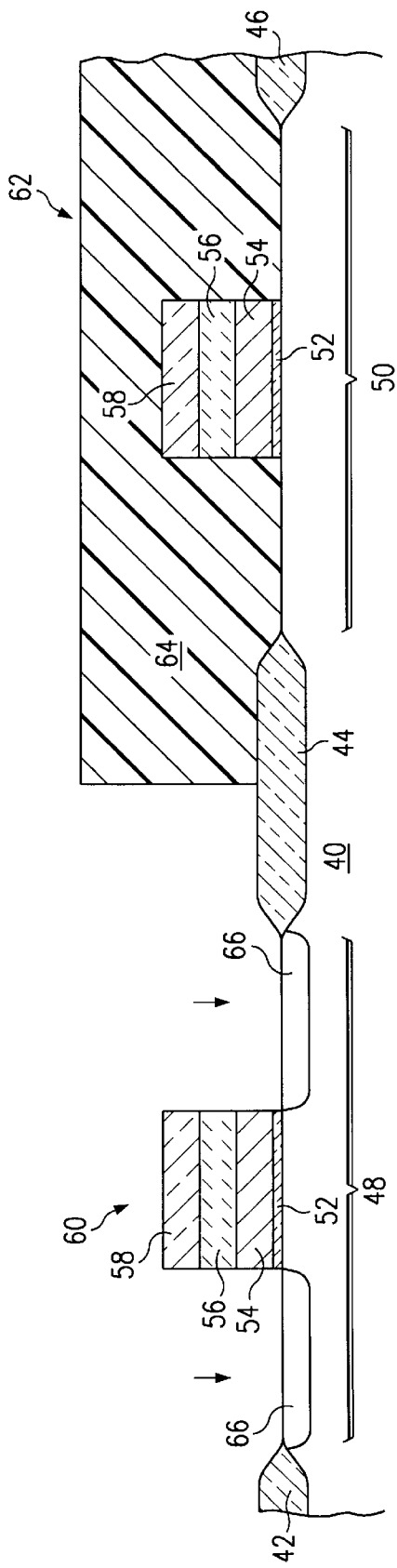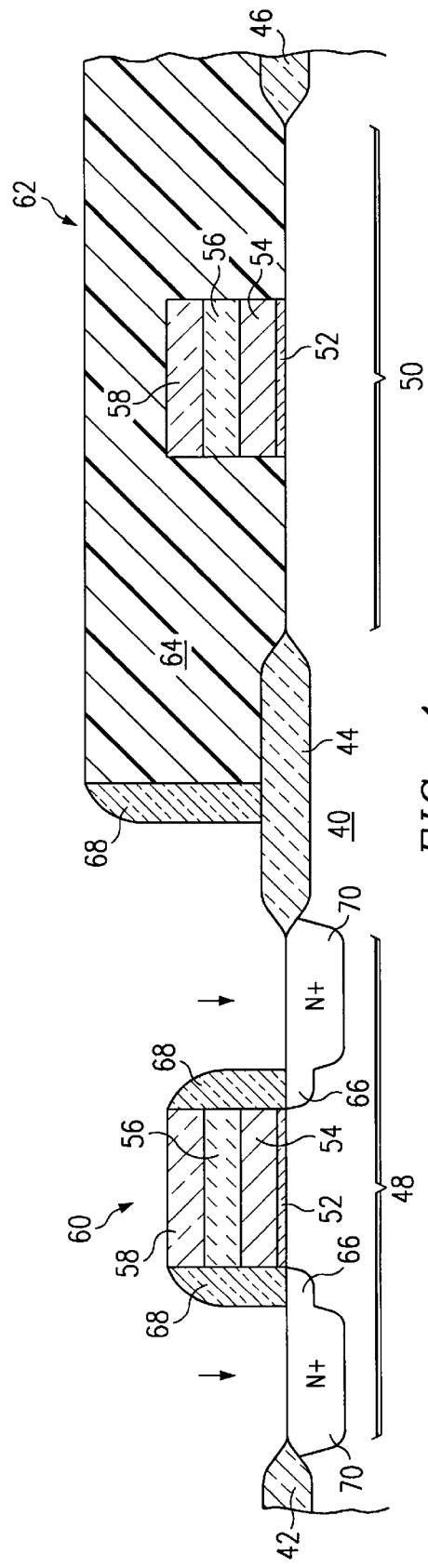

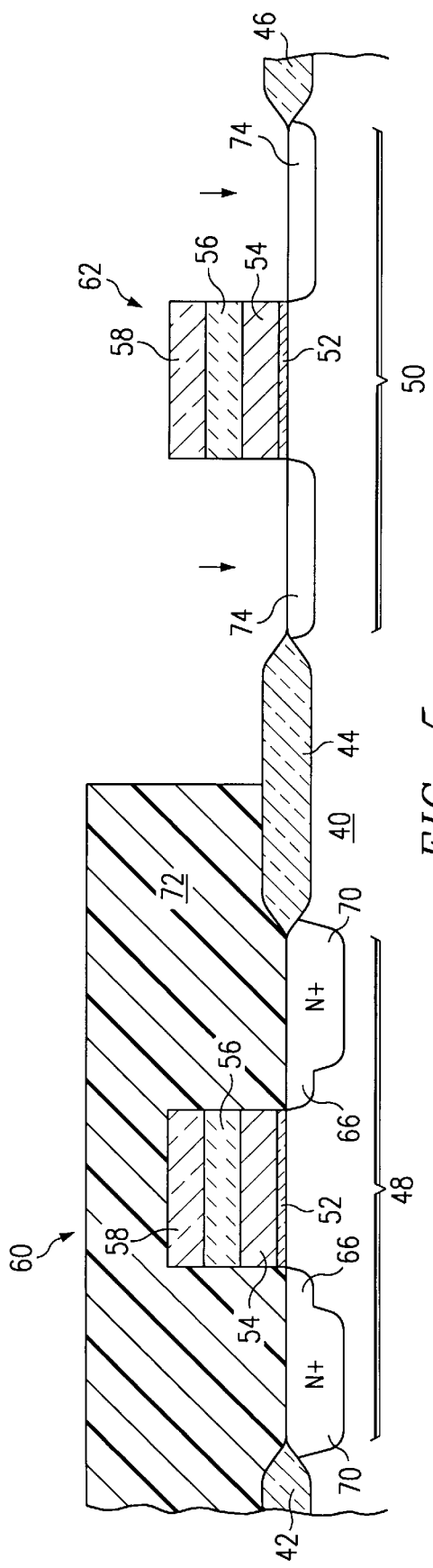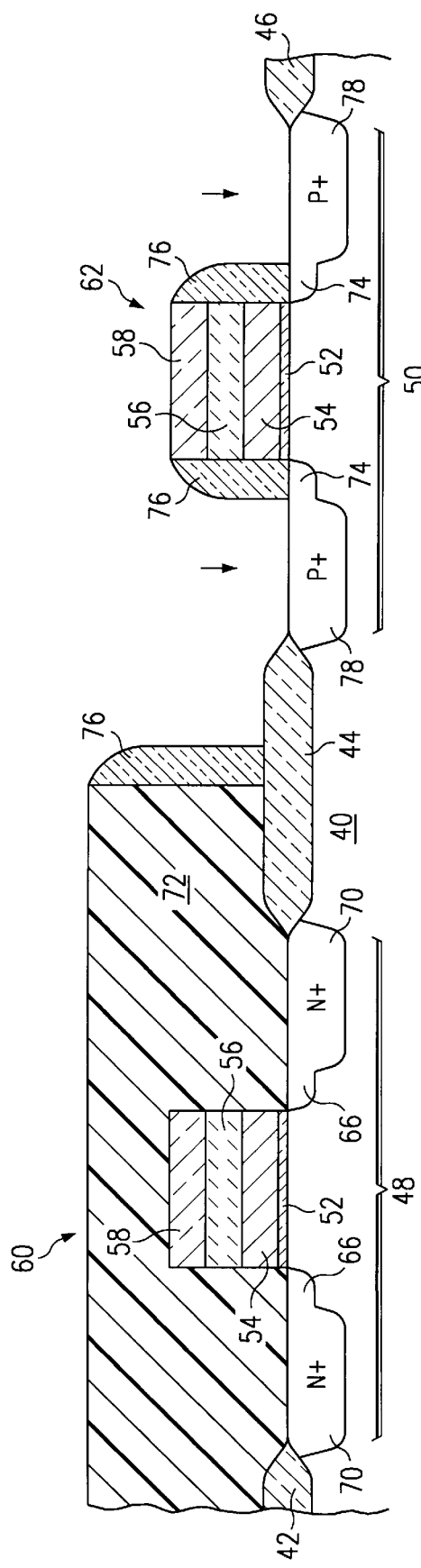

METHOD FOR FORMING INTEGRATED CIRCUIT TRANSISTORS USING SACRIFICIAL SPACER

BACKGROUND OF THE INVENTION

1. Field of the Invention

The present invention relates generally to the formation of integrated circuit structures, and more specifically to a technique for forming self-aligned contacts and integrated circuit devices. The technique is particularly adapted for use with very small device geometries.

2. Description of the Prior Art

As feature sizes continue to shrink for semiconductor integrated circuit devices, certain structures become more difficult to perform. One of these is an electrical contact to a substrate, usually made by a polycrystalline silicon interconnect lead. In order to perform contact structures having minimum resistance, it is desirable to make the contact as large as possible. However, continually shrinking sizes make this a goal which is difficult to reach.

Self-aligned structures have been used in the formation of better contacts. However, at continually shrinking device sizes, even self-aligned contacts have problems.

An example of a structure showing the type of problems found even with self-aligned is given in FIG. 1. A substrate 10 contains field oxide regions 12, 14 which define an active region between them. Within the active region, a transistor is formed by a gate electrode 16. The gate electrode 16 includes a gate oxide layer on the surface of a substrate 10, with a doped polycrystalline silicon layer 20 above it. This is all that is required to define a gate electrode, but many structures also contain a silicide layer 22 to improve conductivity, and a cap oxide layer 24 to protect the gate electrode.

Sidewall oxide spacers 26 are formed alongside the electrode 16, and are used in the formation of LDD regions 28. Highly doped source/drain regions 30 are formed outside the LDD regions as is known in the art.

An oxide layer 32 is formed over the entire device, and an opening 34 is formed in it to create a contact to one of the source/drain regions 30. Oxide layer 32 is a conformal oxide layer deposited as known in the art, and is often referred to as an interpoly oxide (IPO) layer. When IPO layer 32 is etched within the opening 34, a sidewall region 36 remains alongside sidewall spacer 26. Sidewall region 36 has a thickness approximately equal to the deposited thickness of IPO layer 32.

Sidewall region 36 causes a smaller surface area to be available for contact to the source/drain region 30. Because the devices are typically made as small as possible, it is not desirable to increase the surface area of the source/drain region 30 to simply provide a more area for the contact. However, it is not realistic to try to remove the sidewall region 36; over etching or use of a wet etch will tend to damage the substrate as well as surrounding oxide regions. Thus, the space available for contact is made smaller by the area taken up by the sidewall region 36.

It would be desirable to provide a processing method, and a resulting structure, which maximize the substrate surface area available for a self-aligned contact. It would further be desirable for a method to produce such structure to be compatible with presently available processing techniques, and to be available without adding to processed complexity.

SUMMARY OF THE INVENTION

An improved processing technique results in a structure which maximizes contact area by eliminating a sidewall spacer used to form LDD regions. A sacrificial spacer is provided during processing to form the LDD regions, and is then removed prior to further processing of the device. A sidewall spacer is then formed in a self-aligned contact from a later deposited oxide layer used as an interlevel dielectric. This leaves only a single oxide sidewall spacer alongside the gate electrode, maximizing the surface area available for the self-aligned contact itself.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

FIGS. 2 through 9 illustrate a preferred process for forming an improved contact in accordance with the present invention.

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the import ant features of the invention.

The following description illustrates use of the present invention in conjunction with a typical CMOS device. It will be appreciated by those skilled in the art that this invention can be used with either n-channel or p-channel alone.

Figure 2:
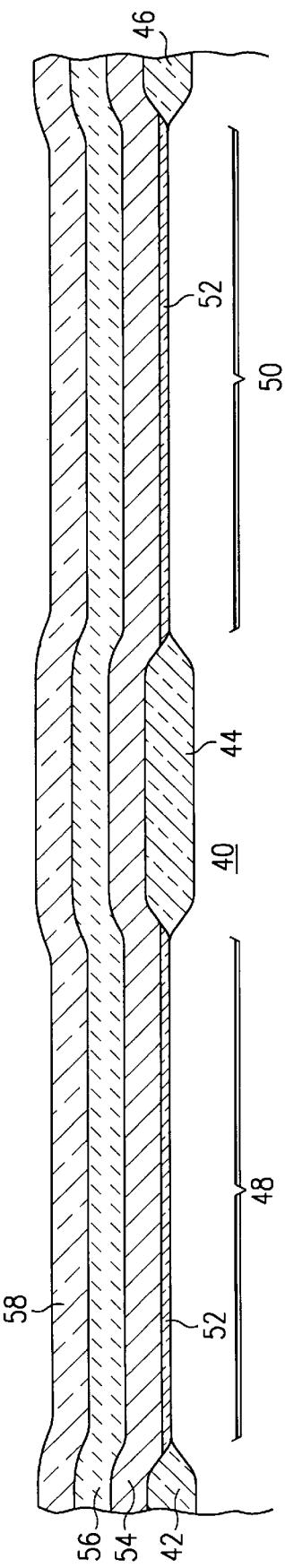

Referring to FIG. 2, within a substrate 40 are formed field oxide regions 42, 44, 46. Active region 48, formed between field oxide regions 42 and 44, will be used for fabrication of an n-channel field effect device. Active region 50 will be used for formation of a p-channel field effect device.

A thermal gate oxide layer 52 is grown over the device as known in the art. Gate oxide layer 52 may be grown using any known techniques, including formation of an oxide-nitride-oxide layer if desired. Polycrystalline silicon layer 54 is then deposited over the device, and doped to provide a desired conductivity. Doping of polycrystalline silicon layer 54 may be done by implant, or using any other technique known in the art.

In order to increase conductivity of the gate electrodes, a silicide layer 56 may be formed over the polycrystalline layer 54 as known in the art. Any of the several well known techniques for forming a refractory metal silicide layer 56 may be used. A protective cap oxide layer 58 is then formed over the device, resulting in the structure shown in FIG. 2. Processing to this point is conventional.

Referring to FIG. 3, the stack just formed is patterned and etched to define gate electrodes 60 and 62. Photo resist layer 64 is formed over the p-channel region 50 in order to protect it during the next few processing steps. A blanket N− implant is then made over the device, forming LDD regions 66. Photo resist layer 64 protects the p-channel regions 50 from this implant. The N− implant is the standard LDD implant well known in the art, and can be, for example, an implant of phosphorus at a dose of 1–10×10$^{13}$/cm$^2$ and implant energy of 5–40 KV.

The processing steps shown in FIG. 3 are also essentially conventional. As shown in FIG. 4, however, the method of the present invention now begins to diverge from standard processing techniques. A conformal polymer layer, or amorphous carbon layer, is formed over the entire device, and anisotropically etched back. This results in the formation of sidewall spacer region 68 along side gate electrode 60 and photoresist layer 64. The sidewall spacer 68 alongside the gate electrode 60 will function as sacrificial sidewall spacers to be removed shortly.

The polymer which is used for layer 68 can be parylene, or any similar carbon-based polymer which can be deposited conformally in a plasma. As described above, a layer of amorphous carbon or other material which can be ashed may also be used. In the remainder of this description, it will be understood that such layers are included when the term polymer layer is used.

In addition to deposition properties, the preferred properties of a polymer layer include a good blocking ability for the following implant step, and the ability to be easily removed when photoresist layer 64 is removed. The polymer layer is preferably deposited to a depth of approximately 1000–2000 angstroms, resulting in sidewall spacers 68 having a width of approximately 1000–2000 angstroms. This defines the width of the LDD regions following the next implant step. The polymer should be deposited at a low temperature, preferably less than approximately 130° C., to prevent damage to the resist layer 64.

After deposition and etch back of the polymer layer to form sidewall regions 68, an N+ implant of arsenic or other suitable dopant is made over the device, forming heavily doped source/drain regions 70. Typically, the arsenic is implanted at a dose of approximately 3×10$^{15}$/cm$^2$, and an energy of approximately 40 KV. Source/drain regions 70 are spaced from the side of the gate electrode 60 of approximately the thickness of sidewall spacer 68, as known in the art. At this time, formation of the n-channel device in active region 48 has been completed.

In order to form the p-channel device, it is necessary to remove photoresist layer 64. This is typically done by ashing, followed by a short clean up using a chemical such as piranha. These standard cleanup steps will remove all traces of the polymer sidewall regions 68, so that no sidewall regions remain alongside the gate electrode 60.

Referring to FIG. 5, photoresist layer 72 is deposited over the wafer and patterned, as known in the art, to cover active region 48 and expose active region 50. If p-type LDD regions are desired, in a manner similar to that described in connection with FIG. 3, a blanket implant of boron is made to form lightly doped drain region 74 for the p-channel device. Typical implants are made at a dose of 1–10×10$^{13}$/cm$^2$, and implant energy of 5–30 KV. A conformal polymer layer is then formed over the device in the same manner as described previously, preferably to a thickness of approximately 1000 angstroms, and anisotropically etched back to form sidewall regions 76. Sidewall regions 76 alongside gate electrode 62 are then used as spacers for the high dosage boron to implant form P+ source/drain regions 78. A typical dosage for the boron implant is 3×10$^{15}$/cm$^2$ at an energy of 5–30 KV. Once source/drain region 78 are formed, photoresist layer 72 and sidewall region 76 are removed by ashing and cleanup as previously described.

Figure 7:
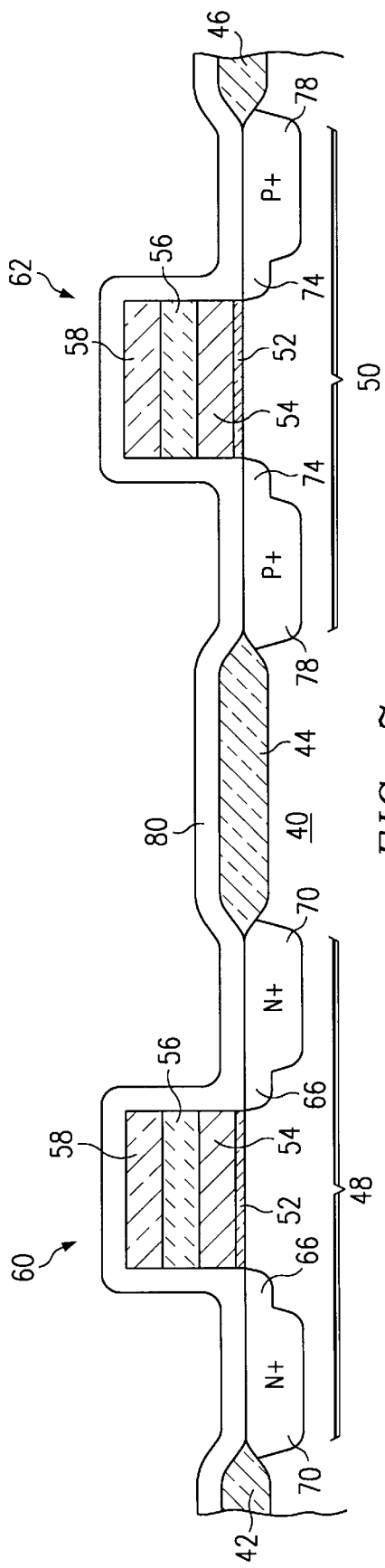

Referring to FIG. 7, the device now includes gate electrodes 60 and 62, neither of which have sidewall spacers of any type. However, the desired LDD structures have been formed through the use of sacrificial polymer spacers as described above. A conformal dielectric layer 80 is deposited over the entire device. This layer 80 is used as the interpoly oxide (IPO) layer. IPO layer 80 is preferably undoped oxide deposited to a thickness of approximately 1000–2000 angstroms.

Figure 8:
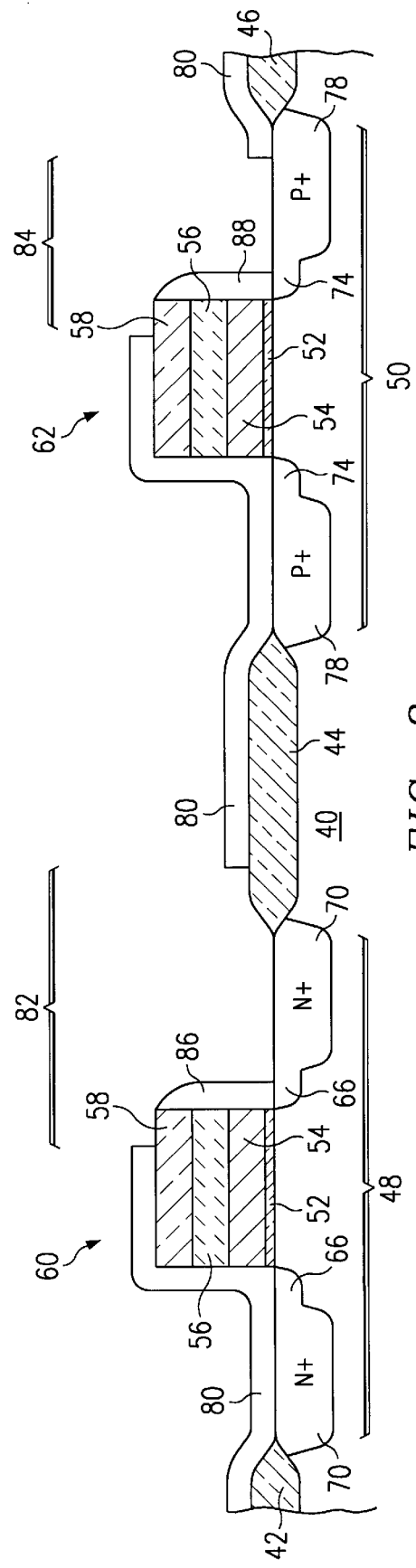

Referring to FIG. 8, the IPO layer 80 is patterned and etched with a photoresist layer (not shown) to form contact openings 82 and 84. Tolerances for formation of these openings is not critical; both of them are self-aligned with respect to the gate electrodes 60 and 62. That portion of the IPO layer 80 which lies within openings 82, 84, alongside the edges of electrodes 60, 62, remains behind as sidewall regions 86, 88. The sidewall spacers 86, 88 perform isolation functions for the respective gate electrodes 60, 62. For any particular transistor, either, both, or neither source/drain region may have a self-aligned contact formed at this time. However, even if a source/drain contact is formed at a later stage, the sidewall spacers 86, 88 will be formed by the IPO layer 80 if such contact is adjacent the gate electrode.

Figure 1:
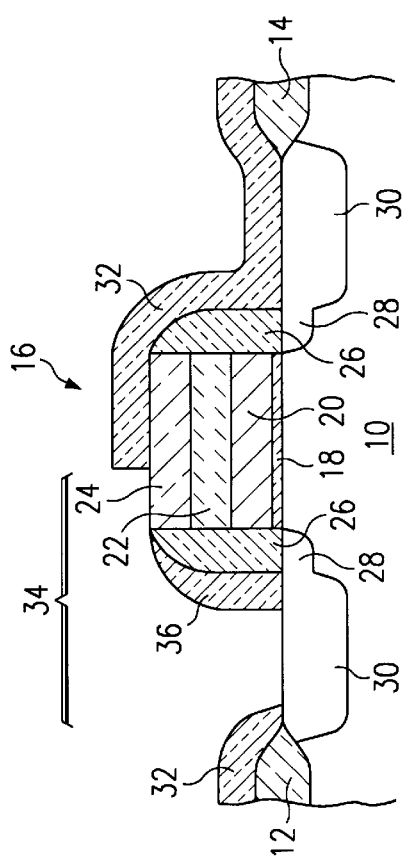
FIG. 1 is a prior art structure.
Figure 9:
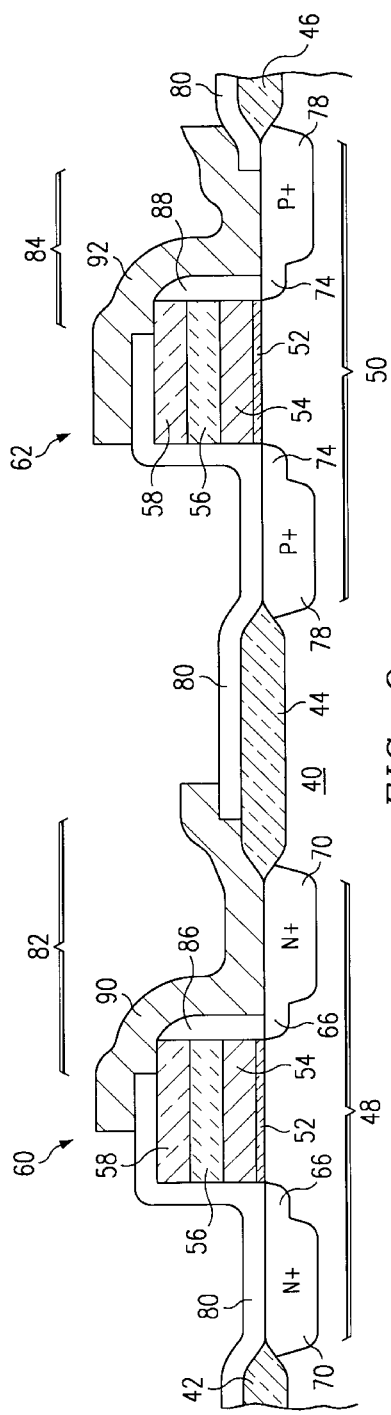

Referring to FIG. 9, a polycrystalline silicon layer is deposited, patterned, and etched as known in the art to form conductive poly electrodes 90, 92. As seen in FIG. 9, sidewall spacers 86, 88 isolate gate electrodes 60, 62, respectively, from interconnect leads 90, 92. It will also be appreciated that the contacts to the underlying substrate 40 are separated from electrodes 60, 62 only by the thickness of spacers 86, 88. Thus, as opposed to the prior art structure seen in FIG. 1, the use of a sacrificial layer for the LDD sidewall spacers allows the contact to be brought closer to gate electrodes 60, 62.

The structure resulting from the method described above is essentially the same transistor structure as widely available on devices made according to known CMOS processing techniques. However, the sidewall spacers alongside the gate electrodes are narrower, due to the removal of the spacers used to form the LDD regions. This gives a larger contact region, thus reducing contact resistance, or closer spacing of elements which can be used to shrink the overall size of the device.

Also, those skilled in the art will appreciate that the method described herein uses less masking steps than is typical for CMOS process. Usually, all sidewall spacers are formed after both P– and N– LDD implants, requiring masking for both the LDD and source/drain implants. The method of the present invention disposes of the sidewalls used to form LDD regions, so only a single mask is needed for both the LDD and source/drain implants. This saves two masking steps over typical prior art techniques.

While the invention has been particularly shown and described with reference to a preferred embodiment, it will be understood by those skilled in the art that various changes in form and detail may be made therein without departing from the spirit and scope of the invention.

What is claimed is:

1. A method for forming a semiconductor integrated device structure, comprising the steps of:
    forming a gate electrode on a surface of a substrate;
    implanting impurities into the substrate to form LDD regions adjacent the gate electrode;
    forming temporary sidewalls alongside the gate electrode and on the substrate surface;
    implanting impurities into the substrate to form heavily doped source/drain regions on either side of the gate electrode and spaced therefrom;

removing the temporary sidewalls;

after removing the temporary sidewalls, forming a conformal dielectric layer over the gate electrode and the substrate; and etching contact openings through the conformal dielectric layer over the heavily doped source/drain regions leaving sidewalls adjacent the gate electrode over the LDD regions.

2. The method of claim 1, wherein the step of forming temporary sidewalls comprises the step of forming temporary sidewalls from a polymer material.

3. The method of claim 2, wherein the polymer is parylene.

4. The method of claim 1, wherein the temporary sidewalls are formed by the steps of:

depositing a conformal layer over the device structure; and anisotropically etching back the conformal layer.

5. The method of claim 4, wherein the conformal layer has a thickness of approximately 1000–2000 angstroms.

6. The method of claim 4, wherein the conformal layer comprises a polymer material which is removable by a process used to remove photoresist.

7. The method of claim 1, wherein the step of etching contact openings through the conformal dielectric layer over the heavily doped source/drain regions leaving sidewalls adjacent the gate electrode over the LDD regions further comprises:

etching the contact openings through portions of the conformal dielectric layer overlying portions of the LDD regions.

8. The method of claim 7, wherein the step of etching contact openings through the conformal dielectric layer over the heavily doped source/drain regions leaving sidewalls adjacent the gate electrode over the LDD regions further comprises:

leaving sidewalls adjacent the gate electrode and overlying a portion of the heavily doped source/drain regions.

9. The method of claim 1, wherein the conformal dielectric layer is undoped oxide.

10. The method of claim 1, wherein the conformal dielectric layer is deposited to a thickness of approximately 1000–2000 angstroms.

11. The method of claim 1, wherein the gate electrode is formed by the steps of:

forming a gate oxide on the substrate surface;

forming a polycrystalline silicon layer on the gate oxide;

forming a protective oxide layer over the polycrystalline silicon layer; and etching the gate oxide, polycrystalline silicon, and protective oxide layers to define the gate electrode.

12. The method of claim 11, further comprising the step of:

forming a silicide layer on the polycrystalline silicon layer before forming the protective oxide layer.

13. The method of claim 1, wherein the step of forming temporary sidewalls comprises the step of forming temporary sidewalls from amorphous carbon.

14. The method of claim 4, wherein the conformal layer comprises a carbon material which is removable by a process used to remove photoresist.

15. A method for forming transistors in a CMOS integrated circuit device, comprising the steps of:

forming first and second gate electrodes over first and second active regions of a substrate, respectively;

forming a first resist layer over the second active region;

implanting impurities into the first active region to form LDD regions adjacent the first gate electrode;

forming a first temporary layer over the first active region, first gate electrode, and the first resist layer;

etching back the first temporary layer to form first temporary sidewalls alongside the first gate electrode;

implanting impurities into the first active region to form heavily doped source/drain regions space from the first gate electrode;

removing the first resist layer and the first temporary sidewalls;

forming a second resist layer over the first active region;

implanting impurities into the second active region to form LDD regions adjacent the second gate electrode;

forming a second temporary layer over the second active region, second gate electrode, and the second resist layer;

etching back the second temporary layer to form second temporary sidewalls alongside the second gate electrode;

implanting impurities into the second active region to form heavily doped source/drain regions space from the second gate electrode;

removing the second resist layer and the second temporary sidewalls alongside the second gate electrode;

after removing the second temporary sidewalls, depositing a conformal oxide layer over the gate electrodes and the active regions; and etching a contact opening through the conformal oxide layer over at least one of the heavily doped source/drain regions, wherein a sidewall is formed between a gate electrode and the contact opening over the LDD regions.

16. The method of claim 15, wherein the step of etching a contact opening through the conformal oxide layer over at least one of the heavily doped source/drain regions:

etching the contact opening through a portion of the conformal oxide layer overlying at least a part of one of the LDD regions.

17. The method of claim 15, wherein the first and second gate electrodes are formed by the steps of:

forming a gate oxide on the substrate surface;

forming a polycrystalline silicon layer on the gate oxide;

forming a protective oxide layer over the polycrystalline silicon layer; and etching the gate oxide, polycrystalline silicon, and protective oxide layers to define the first and second gate electrodes.

18. The method of claim 17, further comprising the step of:

forming a silicide layer on the polycrystalline silicon layer before forming the protective oxide layer.

19. The method of claim 15, wherein the first and second temporary layers each have a thickness of approximately 1000–2000 angstroms.

20. The method of claim 15, wherein the first and second temporary layers are formed from a polymer.

21. The method of claim 20, wherein the first and second temporary layers are formed from parylene.

22. The method of claim 15, wherein the first and second temporary layers are formed from amorphous carbon.

* * * * *